(12) United States Patent
Luen et al.

(10) Patent No.: US 6,430,644 B1
(45) Date of Patent: Aug. 6, 2002

(54) ELECTRONIC DEVICE HAVING A CONFIGURATION FOR CONNECTING AND REMOVING AN EXPANSION MODULE

(75) Inventors: Wong Foo Luen; Goh Kok Keong; Hoong Ting Yeow, all of Singapore (SG)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/354,235

(22) Filed: Jul. 16, 1999

(51) Int. Cl.[7] .............................. G06F 1/16; H05K 5/03
(52) U.S. Cl. ..................... 710/300; 361/726; 361/727
(58) Field of Search .................... 360/683–686, 360/748, 724–730, 732, 735–737; 710/300–304; 439/377, 375, 137; 312/111; 361/679, 741

(56) References Cited

U.S. PATENT DOCUMENTS

| | | | |
|---|---|---|---|
| 5,590,027 A | * | 12/1996 | Provenzale |
| 5,801,922 A | * | 9/1998 | Shen et al. |
| 5,930,110 A | * | 7/1999 | Nishigaki et al. |
| 6,215,656 B1 | * | 4/2001 | O'Neal et al. |
| 6,222,726 B1 | * | 4/2001 | Cha |

* cited by examiner

Primary Examiner—Gopal C. Ray

(57) ABSTRACT

A computing device with an expansion module that may be removed and replaced in an expansion slot by a user with ease and with low risk of damage to the module. The computing device includes computer circuitry to which the expansion module may be electrically connected by means of electrical connectors. The expansion module is coupled to a removable portion of the housing so that when the housing portion is replaced, the expansion module is simultaneously received in the expansion slot. The housing portion may then be slid laterally to a locking position.

12 Claims, 9 Drawing Sheets

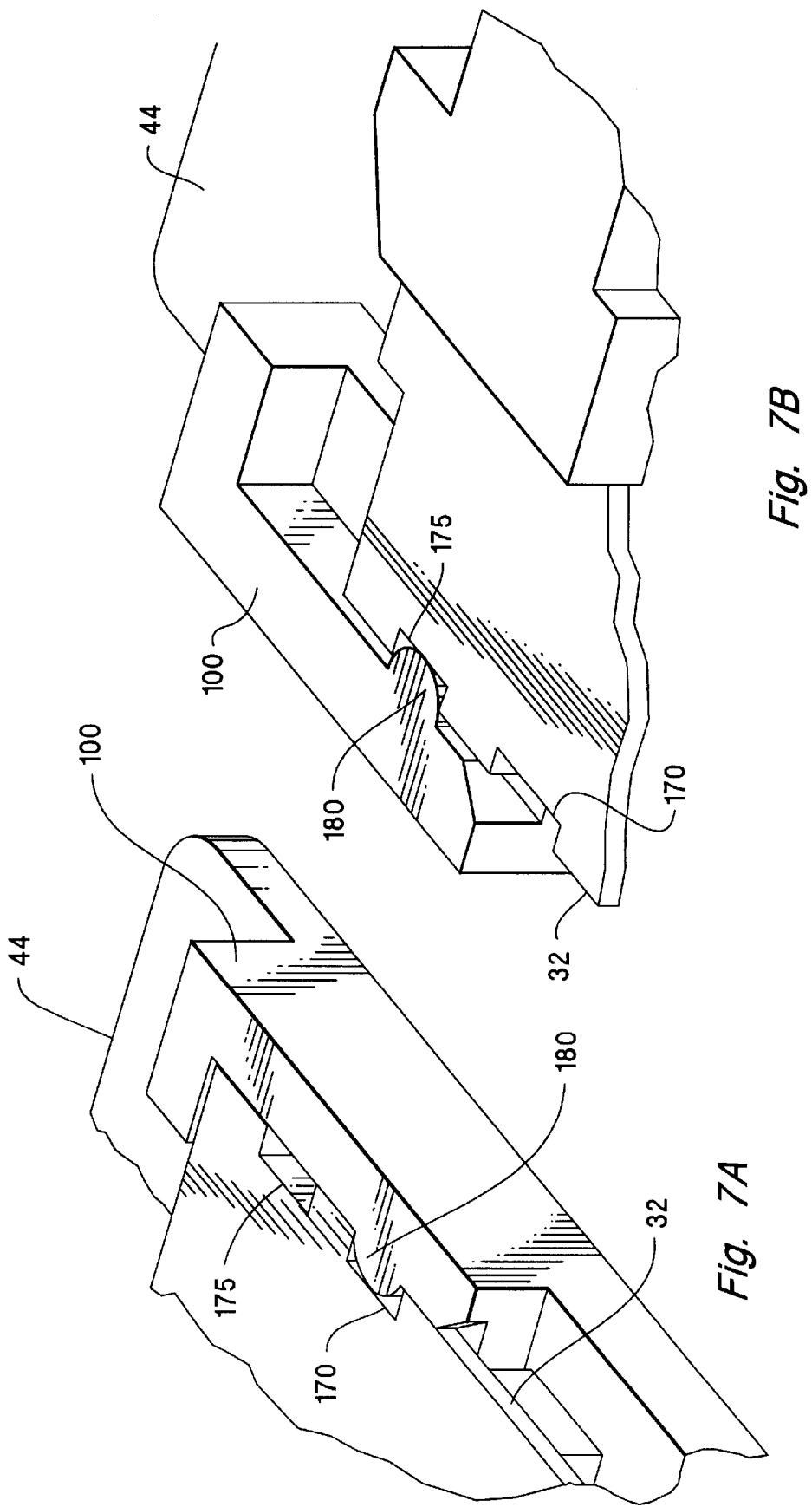

ELECTRONIC DEVICE HAVING A CONFIGURATION FOR CONNECTING AND REMOVING AN EXPANSION MODULE

FIELD OF INVENTION

This invention relates to a computing device with an expansion module.

BACKGROUND OF THE INVENTION

It is well known that the performance of a computer may be enhanced by the use of expansion modules. Known expansion modules or boards may, for example, increase the memory or improve the sound or video capabilities of a computer. The computer will typically receive and accommodate the expansion module in one or more available expansion slots. However, it is also common, as in the case of memory expansion, for an existing module in an expansion slot to be replaced by an expansion module with improved performance. Memory expansion can include both increasing the size of Random Access Memory (RAM) and upgrading information or program code on Read Only Memory (ROM).

Desktop computers typically have expansion slots located within the main casing of the computer. In general, the computer casing has to be opened up before a new expansion module can be added. Portable computers tend to be less expandable than their desktop counterparts. This is usually due to the limited space available within the computer casing.

A known laptop computer, the Omnibook™ 5500CT (available from Hewlett-Packard, USA), includes two memory slots which accommodate two memory expansion boards. To add a new memory board, a user initially removes a cover portion of the housing from the memory expansion slot. If a memory expansion board is already present then it may be pulled out by the user. The user then positions the new memory board over the two connectors in the slot and presses down on the board until it seats fully.

A drawback with the expansion slot in the Omnibook™ computer is that the expansion module is prone to damage. Firstly, the memory board contains memory chips which can be damaged by electrostatic discharge caused by manual handling. Secondly, applying manual pressure directly on the memory board when it is pushed into place can cause the board to crack. The user may not realize that the memory board is seated fully and may further increase pressure on the board in an attempt to position it properly. Thirdly, a user may attempt to position the new memory board in an incorrect orientation in the expansion slot which can result in damage to the connectors and the memory chips.

A known handheld computer, the HP 340LX (available from Hewlett-Packard, USA), uses a ROM chip to store the operating system code. When it is desired to upgrade the operating system, the user simply removes a cover portion from the front of the computer, slides out a circuit board module with the old ROM chip, and replaces it by sliding in a new expansion module with an upgraded ROM chip. Like the Omnibook™ expansion module, the expansion module for the HP 340LX is also prone to damage from manual handling during insertion.

A need exists for a computing device with an expansion module that can overcome the drawbacks of the prior art computing devices.

SUMMARY OF THE INVENTION

The present invention provides a computing device with an expansion module that may be removed and replaced by a user with ease and with less risk of damage to the module. The computing device includes computer circuitry to which the expansion module may be electrically connected. Both the computer circuitry and the expansion module include electrical connectors, which when mated provide the electrical connection. In a preferred embodiment, the expansion module comprises a substrate such as a circuit board with one or more electronic components.

According to the present invention, there is provided a computing device comprising: a computer circuitry including a first electrical connector, an expansion module including a second electrical connector for connecting to the first electrical connector so as to electrically connect the expansion module to the computer circuitry, and a housing substantially enclosing the computer circuitry, the housing including a portion that is removable from and replaceable on a remainder of the housing, said housing portion being coupled to the expansion module such that removal of the housing portion simultaneously removes the expansion module, and replacement of the housing portion connects the first and second electrical connectors, wherein the housing is configured such that, upon replacement of the housing portion, said housing portion is slidable in a predetermined direction relative to the remainder of the housing between an unlocked position in which the housing portion and the expansion module may be removed, and a locked position in which direct removal of the housing portion and the expansion module is prevented.

A computing device in accordance with the invention has the advantage that the housing portion is coupled to the expansion module, which in turn enables the expansion module to be maneuvered by maneuvering just the housing portion. It is therefore possible for a user to avoid handling the expansion module directly. The expansion module is thus less likely to be damaged during removal or replacement.

Preferably, the housing portion and the expansion module are substantially planar, and are coupled in a stacked arrangement.

In a preferred embodiment, the housing defines an opening or aperture which exposes the first electrical connector when the housing portion is removed.

Suitably, the first and second connectors are connected in a direction which is perpendicular to direction in which the housing portion is locked and unlocked.

Ideally, the housing portion is coupled to the expansion module such that housing portion can slide simultaneously relative to both the remainder of the housing and the expansion module. Also, the mating of the first and second connectors may prevent movement of the expansion module whilst the housing portion is being slid.

The housing portion may be locked by one or more catches which catch against the remainder of the housing in the locked position. The housing may also include means for maintaining the housing portion in the locked position.

BRIEF DESCRIPTION OF THE DRAWINGS

FIGS. 7A and 7B are close-up views of FIGS. 6A and 6B showing a retaining mechanism.

DETAILED DESCRIPTION OF A PREFERRED EMBODIMENT

Figure 1:
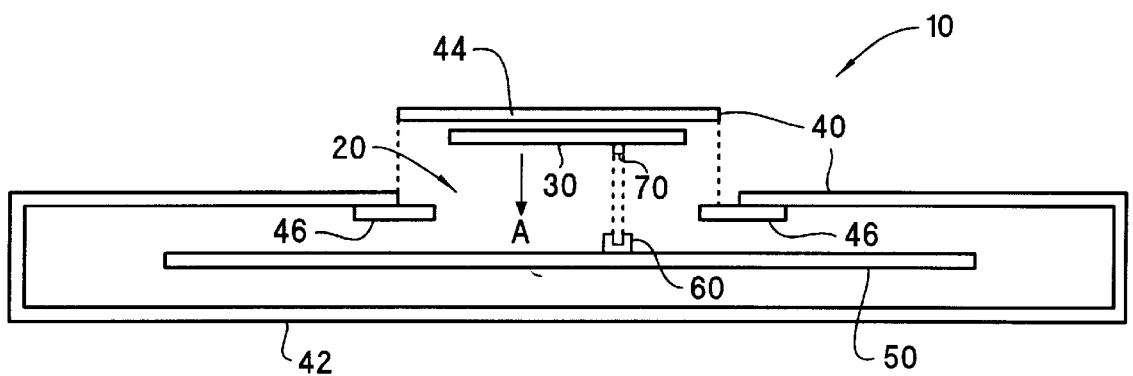
FIG. 1 is a schematic cross-section of a computing device in accordance with the invention, with a cover portion of the housing and an expansion module removed.

Referring to FIG. 1, there is shown a computer 10 with an expansion slot 20 for accommodating an expansion module 30. The computer 10 may be a handheld portable computer, and the expansion module 30 may be a RAM or ROM module.

The computer 10 comprises a generally rectangular housing 40, a mother board 50, and an expansion module 30. The housing 40 is made, for example, of a plastics material and encloses the mother board 50. The mother board 50 is in the form of a standard printed circuit board (PCB) on which a female electrical connector or receptacle 60 is mounted. A plurality of other electronic components are also mounted on the PCB 50, such as, for example, a central processor unit, a video display chip, and a input/output chip. The housing 40 includes a removable cover portion 44 which is designed to be attached and removed from a main body portion 42 of the housing.

The removable cover portion 44 of the housing is coupled to the expansion module 30 such that the expansion module lies adjacent to the major underside surface of the cover 44. The coupling permits relative sliding between the expansion module and the cover in a shear-like manner. The expansion module 30 includes a male electrical connector or plug 70 mounted on a surface which faces away from the cover 44 in the coupled state.

Figure 2:
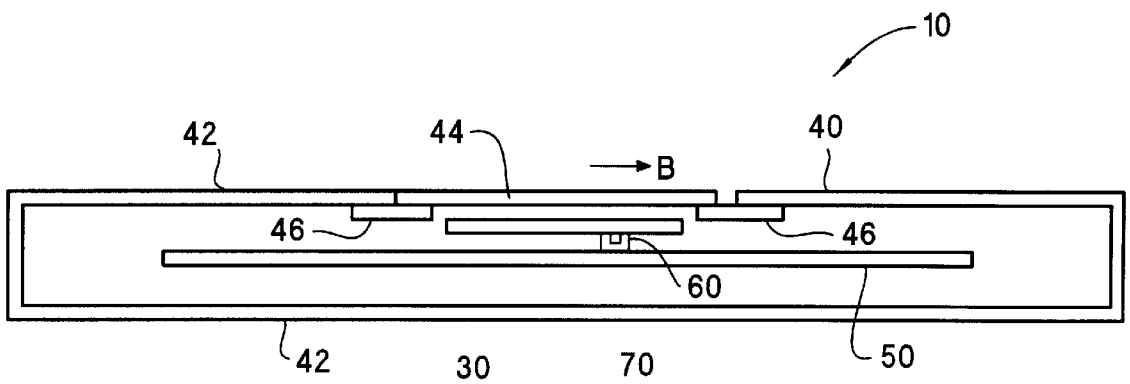
FIG. 2 is a schematic cross-section similar to FIG. 1 but with the cover portion and the expansion module replaced and in an unlocked position.

With the cover 44 removed, the main body portion 42 of the housing defines an aperture that forms the opening of the expansion slot 20. At the perimeter of the aperture, the main body of the housing is stepped down to provide a plurality of support lips 46. Referring to FIG. 2, the support lips 46 are positioned to support the cover 44 upon replacement, such that the cover 44 becomes flush with the remainder of the housing 42.

The cover 44 and the expansion module 30 are coupled together in a preset configuration which allows the expansion module to be received and accommodated in the expansion slot 20 whilst the cover 44 simultaneously closes the aperture in the housing. The process of insertion involves lowering the coupled cover and expansion module into the expansion slot, module first, as indicated by arrow A in FIG. 1. During this insertion, the preset configuration of the cover and the expansion module causes the plug 70 on the expansion module to simultaneously mate with the receptacle 60 on the mother board, as illustrated in FIG. 2. Subsequent removal of the expansion module from the expansion slot 20 causes the plug 70 and the receptacle 60 to detach from each other.

With the expansion module accommodated in the expansion slot 20 and the cover 44 closing the aperture, the cover 44 may be slid on the supports 46 in a direction indicated by arrow B in FIG. 2. This direction is in the major plane of the cover 44 and is perpendicular to the direction in which the expansion module is inserted into the expansion slot and to the direction of mating of electrical connectors 60, 70. The electrical connectors 60, 70 are designed such that relative movement is prevented in a direction lateral to the direction of mating. Thus, the plug 70 and the expansion module remain stationary relative to the mother board and the remainder of the housing whilst the cover 44 is slid in direction B. The slidable coupling between the cover 44 and the expansion module 30 enables the expansion module to remain stationary.

Figure 3:
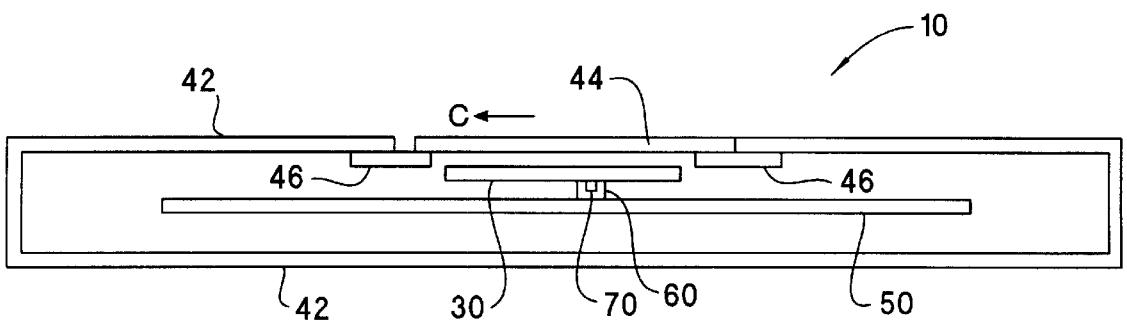
FIG. 3 is a schematic cross-section similar to FIG. 1 but with the cover portion and the expansion module replaced and in a locked position.

The cover 44 may be slid in direction B until it reaches the position shown in FIG. 3. In this position, the cover 44 locks against the remainder of the housing 42 such that direct removal of the cover and hence the expansion module is prevented. If it is desired to remove the cover and the expansion module, the cover can be slid back to the unlocked position of FIG. 2 in the direction indicated by arrow C in FIG. 3.

The computing device shown in FIGS. 1 to 3 will now be described in more detail with reference to FIGS. 4 to 10. The same reference numerals are used to refer to equivalent features.

Coupling of Expansion Module and Cover Portion

Figure 4:
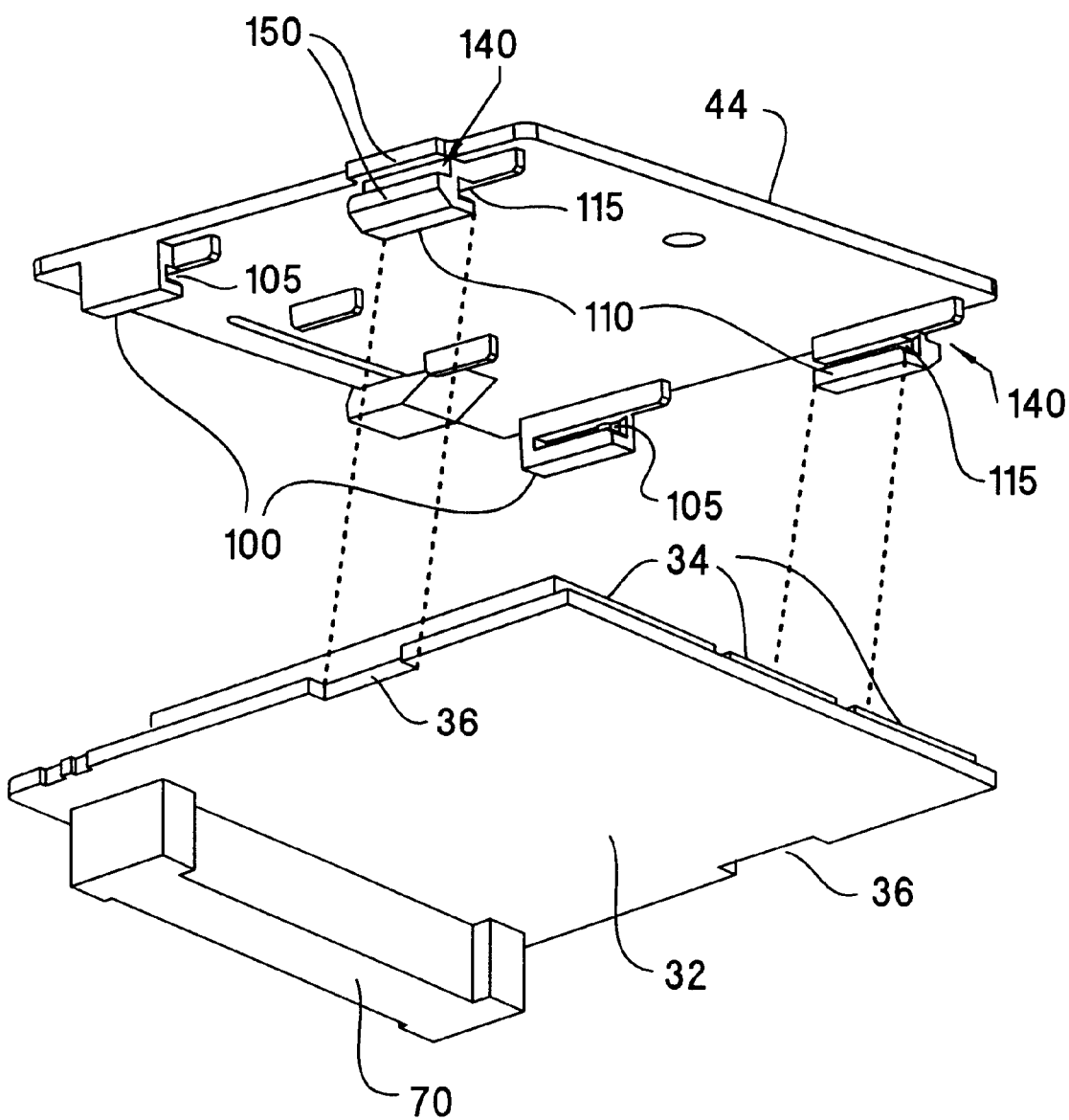
FIG. 4 is a perspective view of a cover portion of a computer housing and an expansion module in accordance with the invention.
Figure 5:
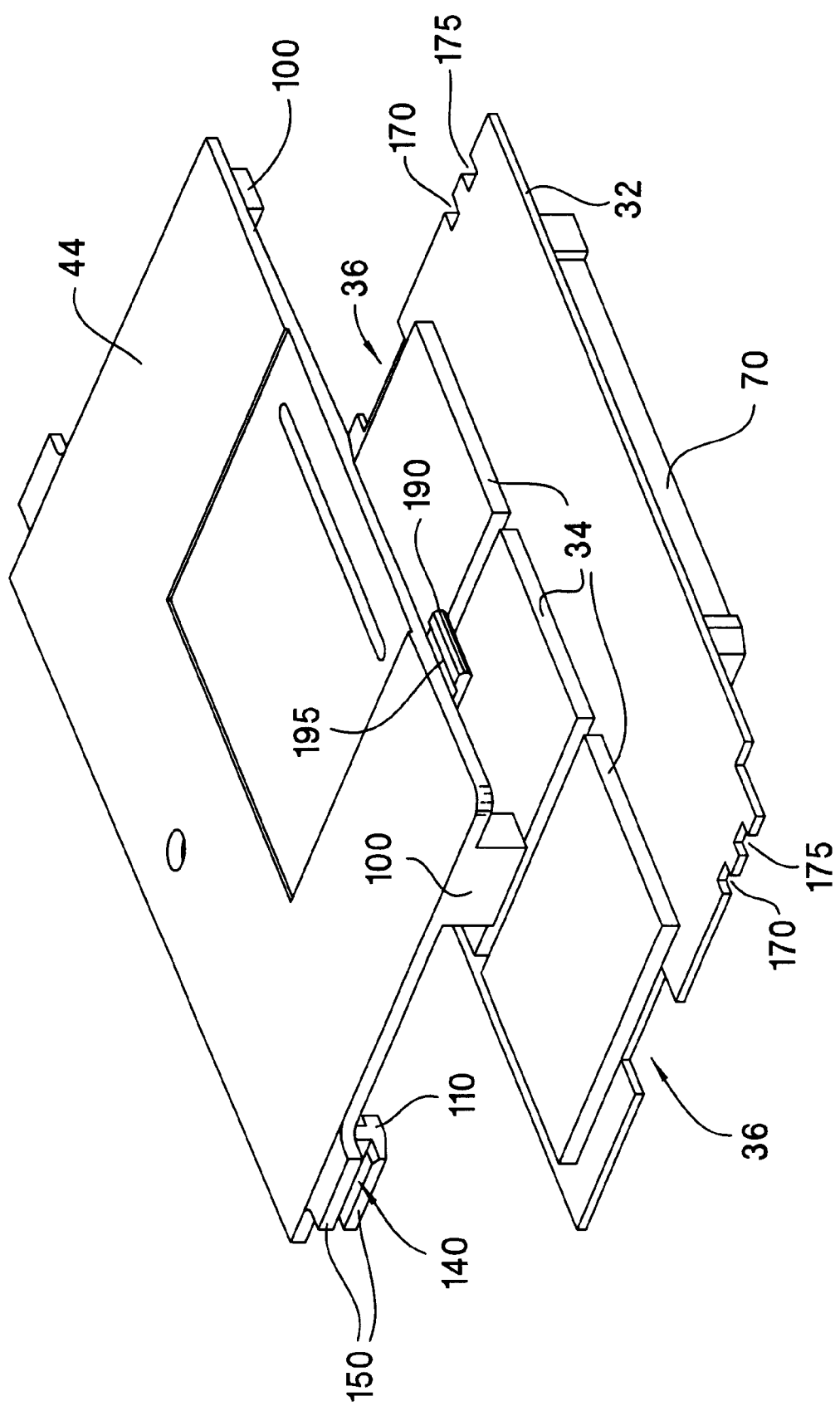
FIG. 5 is a perspective view similar to FIG. 4 but from a different angle.

In FIGS. 1 to 3, the expansion module 30 was shown slidably coupled to the cover portion 44 of the housing 40. FIGS. 4 and 5 illustrate the detailed structure of the expansion module 30 and cover 44 which facilitates this slidable coupling. In the preferred embodiment, the cover and the expansion module are generally planar and rectangular.

As shown in FIG. 4, the cover 44 includes a pair of front arms 100, located towards the front of the cover, and a pair of rear arms 110, located towards the rear of the cover, all arms depending generally downwards from the underside of the cover. The front and rear arms 100, 110 are located on opposite sides of the cover, i.e. one front arm and one rear arm are located on the left-hand side of the cover, and the other front arm and rear arm are located on the right-hand side of the cover. Each arm in each pair is angled back towards the opposite arm in the pair to define a pair of front longitudinal channels 105, and a pair of rear longitudinal channels 115.

The expansion module 30 comprises a generally rectangular printed circuit board 32 on which memory chips 34 and the electrical plug connector 70 are mounted. The dimensions of the printed circuit board are such that the left and right hand sides of the PCB may be accommodated in the corresponding left and right sets of channels in the cover.

To couple the expansion module to the cover, the PCB 32 may be inserted into the pair of rear longitudinal channels 115 and slid forwards until it is received in the pair of front longitudinal channels 105. Alternatively, however, the cover includes a pair of indents 36 on opposite sides of the PCB, allowing the PCB to avoid the pair of rear arms 115, as shown by the dashed lines in FIG. 4. Thus, the PCB may be slid into the front and rear longitudinal channels 105, 115 simultaneously.

The front longitudinal channels 105 of the cover 44 are blocked at the front end, preventing the PCB 32 from being slidably received beyond a certain point. With the PCB received at this point, however, the cover and expansion board are in the preset configuration required for insertion into the expansion slot (see FIGS. 1 and 2). This preset configuration is shown in FIG. 6A.

A retaining protrusion 180 is provided in each of the front channels 105 of the cover 44 for interacting with a retaining profile on the side of the PCB. In the preset configuration, each retaining protrusion 180 locates in a first indent 170 in the side of the PCB 32, as shown in FIGS. 6A and 7A. The protrusion must be urged out of the first indent before the PCB and the cover can slide relative to each other. The effect of this urging helps to maintain the expansion module and the cover in the preset configuration.

Figures 6A, 6B:
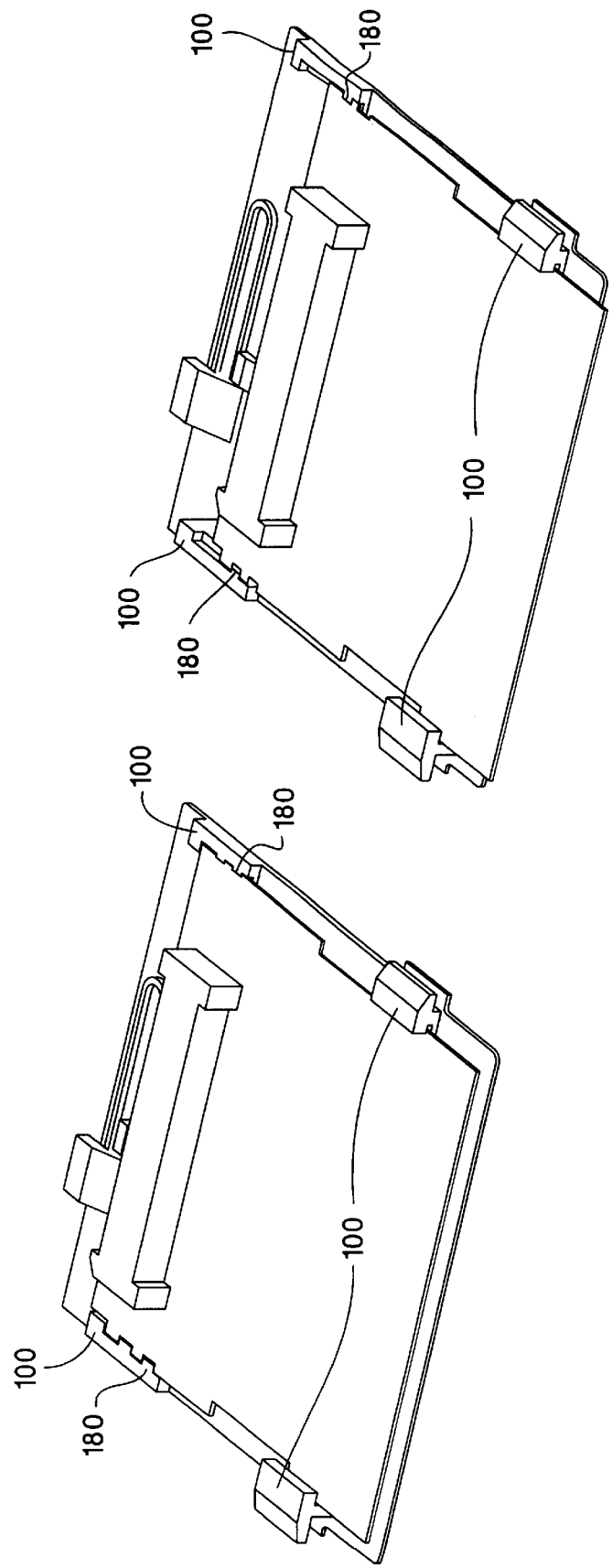
FIGS. 6A and 6B are perspective views of the cover portion and the expansion module of FIG. 4 in a coupled state.

When the cover 44 is slid to the locked position, the configuration of the expansion module 30 and the cover 44 changes, as shown in FIGS. 3 and 6B. This change from the preset configuration to the locked configuration of FIGS. 3 and 6B urges each retaining protrusion from the first indent 170 to a second indent 175. Again, the protrusion must be urged out of the second indent before the PCB and the cover can slide relative to each other. The effect of this urging helps to maintain the expansion module and the cover in the locked configuration.

The combined effect of the two indents 170, 175 and the retaining protrusion 180 causes the cover to "snap" between the unlocked and locked positions of FIGS. 2 and 3 respectively.

Coupling of Cover Portion and Main Body Portion

Figure 8:
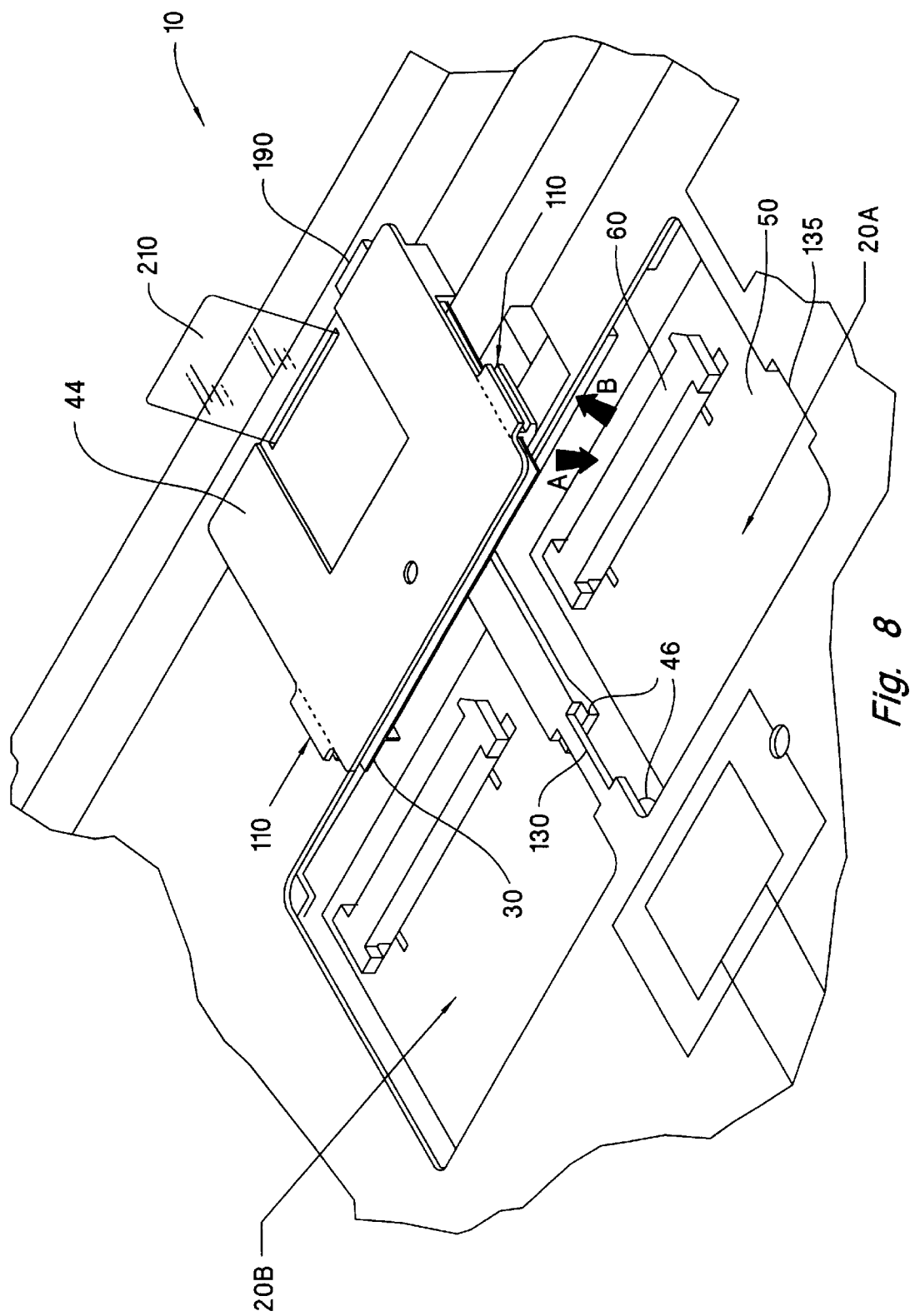
FIG. 8 is a perspective view of a computing device in accordance with the invention, with a cover portion of the housing and an expansion module shown removed.
Figure 9:
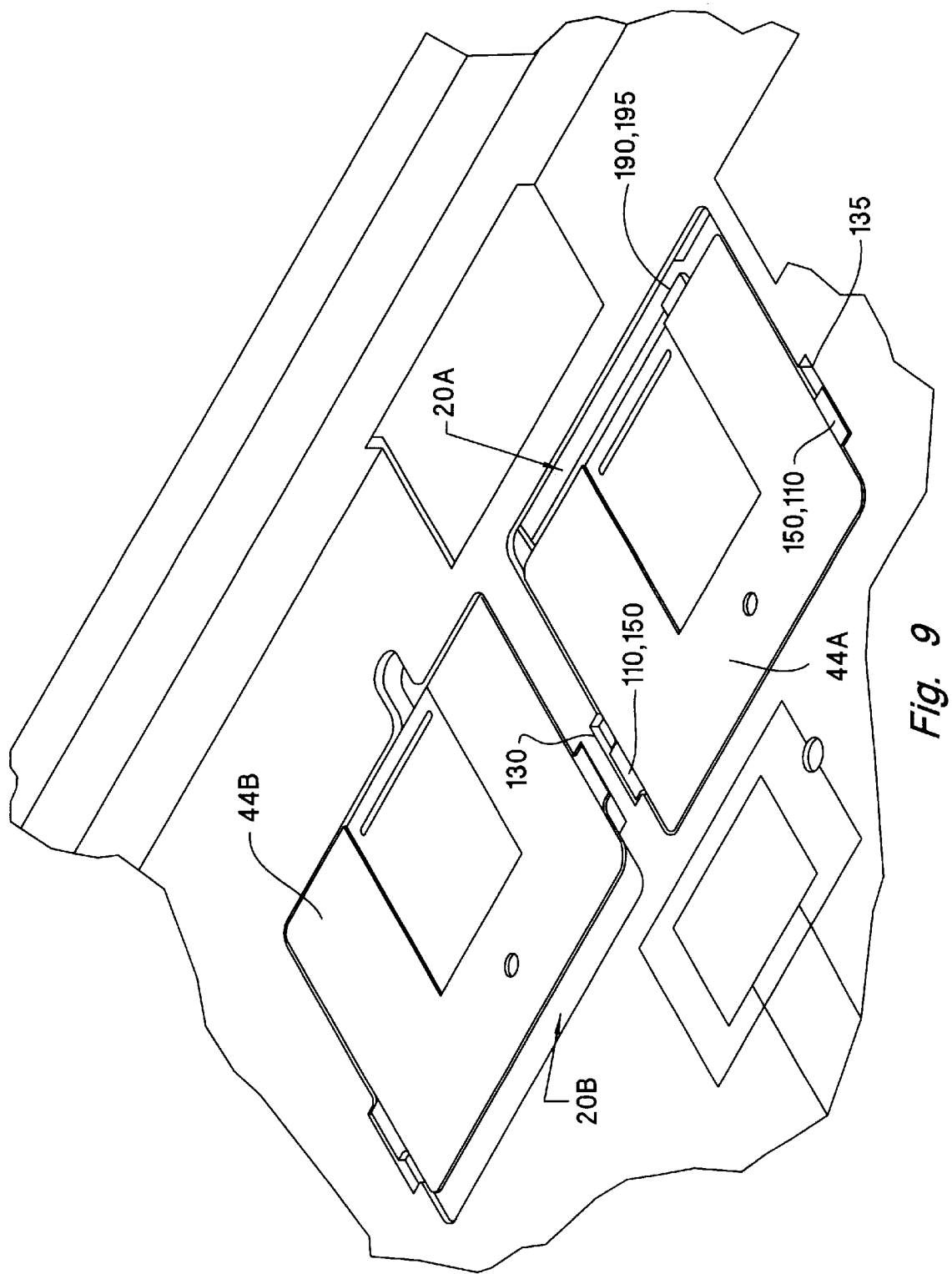
FIG. 9 is a perspective view of the computing device of FIG. 8 with a cover portion shown in an unlocked position in one expansion slot, and a cover portion shown in a locked position in another expansion slot.

The schematic cross-sections of FIGS. 1 to 3 are represented three dimensionally and in greater detail in FIGS. 8 and 9. Referring to FIG. 8, there is shown a computer 10 with two expansion slots 20A and 20B. The coupled expansion module 30 and cover 44 are shown removed from the expansion slot 20A. In FIG. 9, a first cover 44A is shown in the unlocked position in expansion slot 20A, and a second cover 44 is shown in the locked position in expansion slot 20B.

Figure 10:
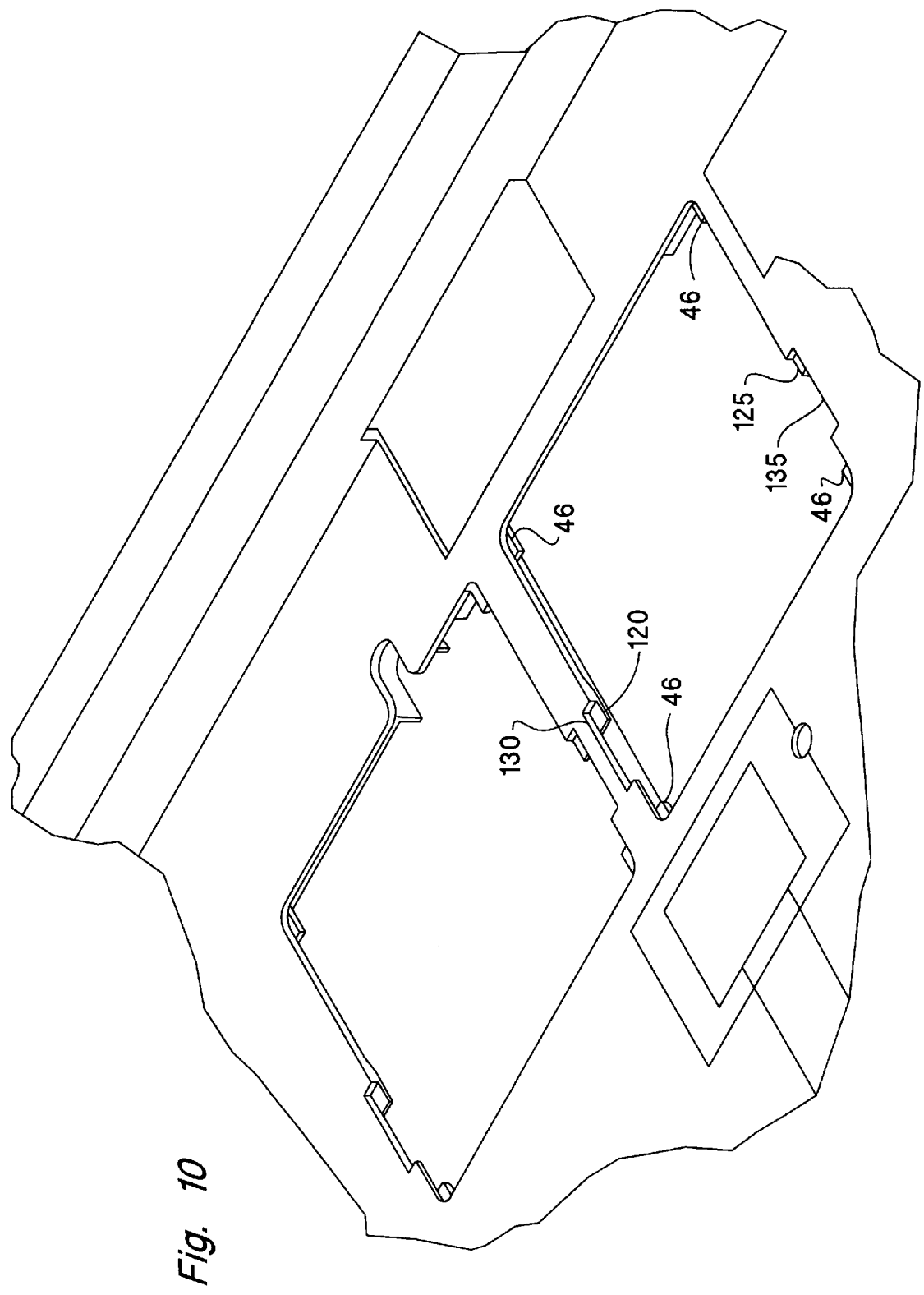
FIG. 10 is a perspective view of the main body portion of the housing of FIG. 9.
Figure 11:
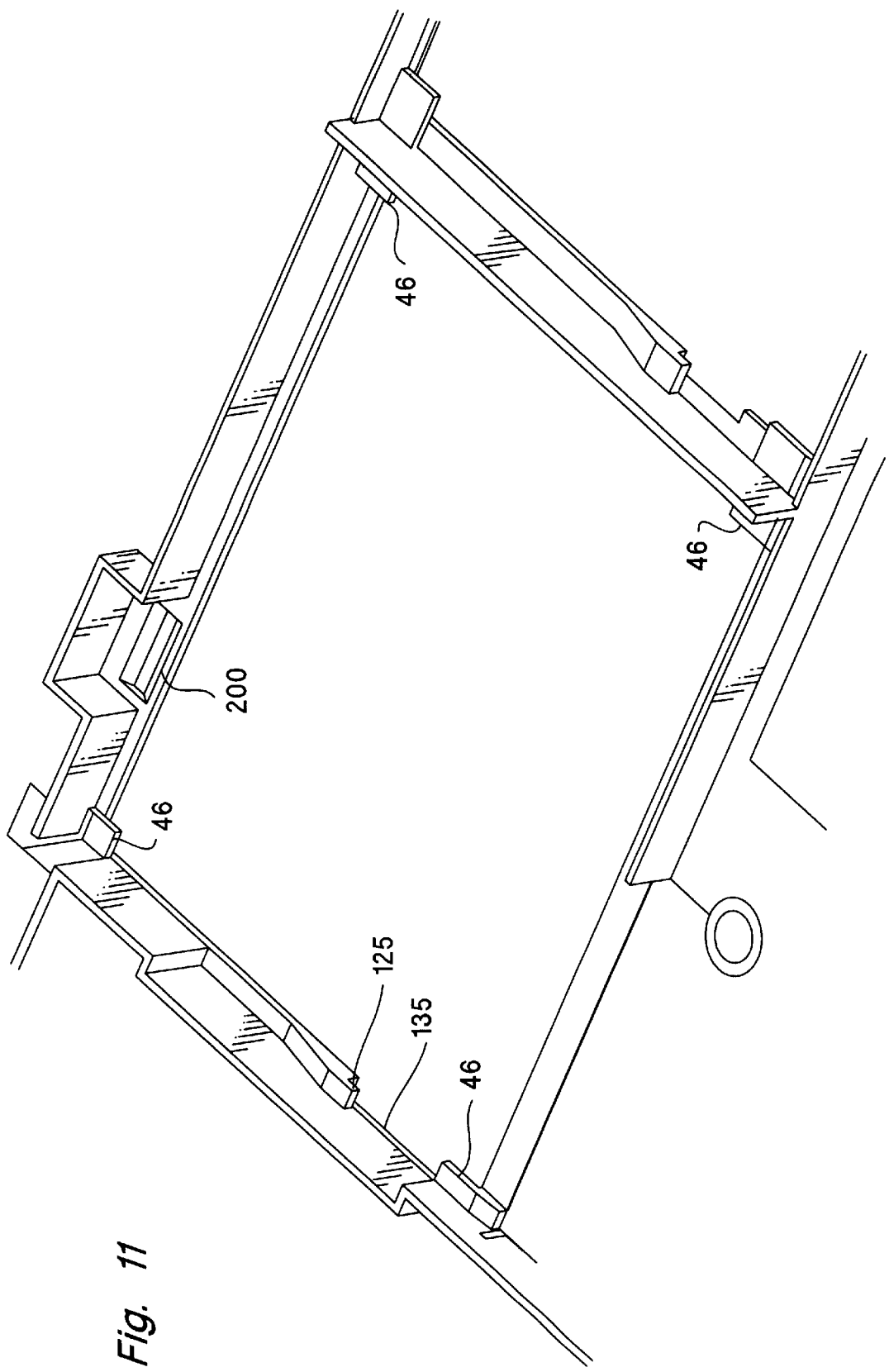
FIG. 11 is a perspective view of the main body portion of FIG. 10 viewed from inside the expansion slot.

As shown in FIGS. 10 and 11, the support lips 46 mentioned previously are located at the four corners of the aperture to support the cover 44 upon replacement, such that the cover 44 becomes flush with the remainder of the housing 42. The supports 46 are sufficiently dimensioned to allow the cover 44 to be slid between the locked and unlocked positions shown in FIG. 9.

As shown in FIGS. 4 and 5, each one of the rear arms 110 on the cover 44 includes a pair of flanges 150 depending away from the cover. Each pair of flanges 150 defines a longitudinal channel 140 extending in the same direction as the four channels 105, 115. The cover 44 also includes a tab 190 depending forwards from below the front edge.

The flanges 150 extend outwards from each side of the cover. Accordingly, to allow the cover to be received, the aperture in the main body portion 42 of the housing is also extended outwards by the cut away sections 130, 135 (see aperture and cover 44A in FIG. 9). Both the cut away sections 130, 135 and the tab 190 ensure that the cover 44A is received in a correct orientation and in the unlocked position in the aperture.

FIG. 10, a tooth 120, 125 is provided towards the front portion of each cut away section 130,135. These teeth 120, 125 prevent the cover from being received directly in the locked position.

Once the cover is fully seated in the unlocked position, it may be slid forwards to the locked position, as illustrated by the cover 44B in FIG. 9. During this sliding, the teeth 120, 125 in the cut away sections enter the front of the channels 140 of the cover 44, while the tab 190 of the cover 44 catches under the perimeter of the aperture. When the cover is in the locked position, the tab positioned under the perimeter of the aperture, and the lower flanges 150 positioned under the teeth 120, 125 act as catches, preventing the cover from being removed upwards. The cover 44 and the expansion module 30 beneath it are thus locked in place until the cover is slid back to the unlocked position.

As mentioned previously, the action of the retaining profiles on the PCB 32 help to retain the cover in the locked and unlocked positions. The cover 44 is also retained in the locked position by the action of a barb 195 which extends upwards from the tab 190. In the locked position, the barb 195 engages in a complementary recess 200 on the underside of the perimeter of the aperture (see FIG. 11) to hold the cover in position.

A flexible piece of tape 210 may be fixed to the front of the cover 44 (see FIG. 8). This tape 210 may be gripped by a user to help move the cover from the locked position to the unlocked position, and to help remove the cover and the expansion module out of the expansion slot.

Expansion Module Upgrade

Upgrading of an expansion module locked into the computer 10 may be performed by a user as follows. The user slides the cover 44 coupled to the existing module 30 from the locked position to the unlocked position. The user then lifts the cover 44 away from the expansion slot, preferably by means of the flexible tape 210. As the cover is lifted away, the existing module coupled to the cover is removed from the expansion slot. A new expansion module and cover coupled in the preset configuration may then be inserted into the expansion slot. Finally, the user slides the cover 44 into the locked position.

Insertion of a new expansion module may also be performed during manufacture of a computer. For example, different ROM modules may be inserted depending on which country the computer is intended to be sold in. Because only the cover is being handled by the user, there is less likelihood of damage to the expansion module during assembly.

It will be evident in view of the foregoing description that various modifications may be made within the scope of the present invention. For example, the male and female electrical connectors may be reversed, or the catches holding the cover 44 in place in the locked position may be provided by alternative means.

What is claimed is:
1. A computing device comprising:
   a computer circuitry including a first electrical connector,
   an expansion module including a second electrical connector for connecting to the first electrical connector so as to electrically connect the expansion module to the computer circuitry, and
   a housing substantially enclosing the computer circuitry, the housing including a portion that is removable from and replaceable on a remainder of the housing, said housing portion being coupled to the expansion module such that removal of the housing portion simulta- neously removes the expansion module, and replacement of the housing portion connects the first and the second electrical connectors, wherein the housing is configured such that, upon replacement of the housing portion, said housing portion is slidable in a predetermined direction relative to the remainder of the housing between an unlocked position in which the housing portion and the expansion module may be removed, and a locked position in which direct removal of the housing portion and the expansion module is prevented.

2. The computing device as claimed in claim 1, wherein the housing portion and the expansion module are substantially planar.

3. The computing device as claimed in claim 1, wherein the housing portion and the expansion module are coupled in a stacked arrangement.

4. The computing device as claimed in claim 1, wherein the remainder of the housing defines an opening for exposing the first electrical connector, said opening being closed by replacement of said housing portion.

5. The computing device as claimed in claim 1, wherein the first and the second connectors are connectable in a direction perpendicular to said predetermined direction.

6. The computing device as claimed in claim 1, wherein the housing portion is slidably coupled to the expansion module such that, upon replacement of the housing portion, said housing portion is slidable relative to the expansion module in said predetermined direction.

7. The computing device as claimed in claim 1, wherein connection of the first and the second connectors prevents relative movement between the expansion module and the remainder of the housing in said predetermined direction.

8. The computing device as claimed in claim 1, wherein the expansion module comprises a substrate with one or more electronic components.

9. The computing device as claimed in claim 1, wherein the housing portion includes one or more catches which catch against the remainder of the housing when the housing portion is in the locked position.

10. The computing device as claimed in claim 1, wherein the housing includes means for maintaining the housing portion in the locked position.

11. The computing device as claimed in claim 1, wherein the housing portion defines a channel for slidably receiving the expansion module.

12. A cover arrangement in an electronic device, the electronic device having an electronic circuit to which an electronic module is electrically connectable through electrical connectors therein, the cover arrangement comprising:

a socket for exposing a first electrical connector in the electronic circuit;

a cover that removably overlays the socket; and a coupler for releasably coupling a second electrical connector in the electronic module onto the cover so that the second electrical connector is disposable on the cover wherein it is capable of simultaneously mating with the first electrical connector when the cover is caused to removably overlay the socket thereby enabling an electrical connection between the electronic circuit and the electronic module.

* * * * *

UNITED STATES PATENT AND TRADEMARK OFFICE
CERTIFICATE OF CORRECTION

PATENT NO. : 6,430,644 B1  
DATED : August 6, 2002  
INVENTOR(S) : Foo Luen WONG, Kok Keong GOH and Ting Yeow HOONG It is certified that error appears in the above-identified patent and that said Letters Patent is hereby corrected as shown below:

<u>Title page,</u>  
Item [75], Inventors' names should read as follows:  
"Wong Foo Luen" should read as -- Foo Luen WONG --  
"Goh Kok Keong" should read as -- Kok Keong GOH --  
"Hoong Ting Yeow" should read as -- Ting Yeow HOONG --

Signed and Sealed this

Thirty-first Day of December, 2002

JAMES E. ROGAN  
*Director of the United States Patent and Trademark Office*